United States Patent [19]

Inoue et al.

[11] 4,215,295
[45] Jul. 29, 1980

[54] DEFLECTION CIRCUIT FOR A PICTURE TUBE

[75] Inventors: Fumio Inoue, Yokohama; Nobuyuki Suzuki, Kamakura, both of Japan

[73] Assignee: Hitachi, Ltd., Tokyo, Japan

[21] Appl. No.: 940,008

[22] Filed: Sep. 6, 1978

[30] Foreign Application Priority Data

Sep. 9, 1977 [JP] Japan .................... 52-107792

[51] Int. Cl.² .................... H01J 29/70; H01J 29/76
[52] U.S. Cl. .................... 315/408; 315/397
[58] Field of Search .................... 315/396, 397, 408

[56] References Cited

U.S. PATENT DOCUMENTS 3,774,068 11/1973 Yasumatsuya .................... 315/397

Primary Examiner—Theodore M. Blum
Attorney, Agent, or Firm—Craig & Antonelli

[57] ABSTRACT

A sawtooth wave generated in a sawtooth wave generator circuit of a vertical deflection circuit assumes a predetermined maximum voltage at the start of a vertical scan and a minimum voltage which changes depending on a vertical cycle period at the end of the vertical scan. A pulse generator generates a sampling pulse at the end of the vertical scan so that the sawtooth wave voltage at the end of the vertical scan is sampled by the sampling pulse. The sampled sawtooth wave is held until a next sampling pulse is generated so that a D.C. voltage which changes in accordance with the vertical cycle period is produced. The sawtooth wave voltage is level-shifted by a level shifting circuit and thereafter amplified before it is supplied to a vertical deflection coil. The amount of shift by the level shifting circuit is controlled by the D.C. voltage so that the sawtooth wave having a stabilized D.C. component is amplified. Accordingly, a vertical deflection circuit free from D.C. component variation can be derived and the swing of image can be suppressed.

8 Claims, 2 Drawing Figures

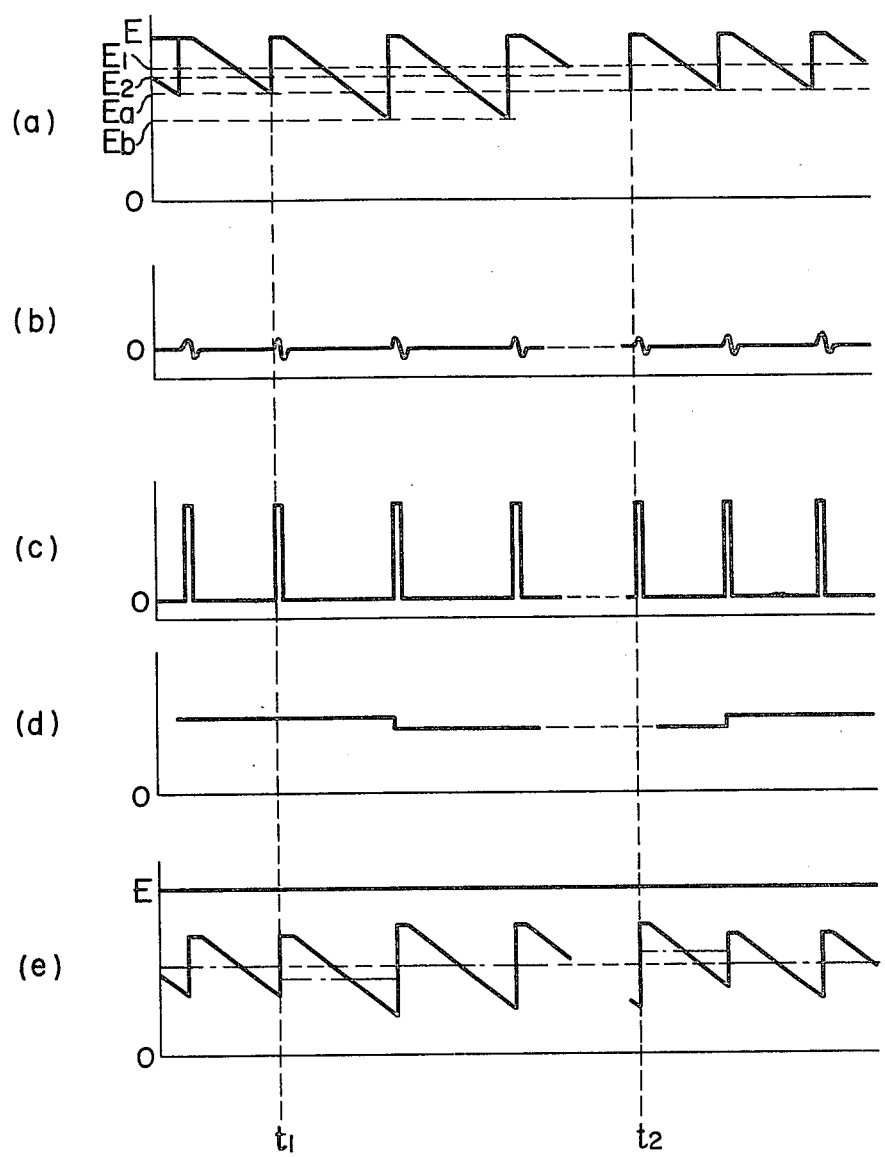

DEFLECTION CIRCUIT FOR A PICTURE TUBE

BACKGROUND OF THE INVENTION

1. Field of the Invention

The present invention relates to a deflection circuit which prevents an image displayed on a picture tube from being swung by a change of a D.C. component in a deflection current when a channel is switched.

2. Description of the Prior Art

Japanese Patent Application Kokai (Laid-Open) No. 114113/75 discloses a deflection circuit comprising a sawtooth wave generator circuit including a capacitor, a current source for charging or discharging the capacitor at a constat rate during a scan period to produce a voltage of a predetermined gradient across the capacitor and a switch adapted to be closed during a retrace period to restore the capacitor voltage to an initial charged voltage at the start of scan, a deflection coil, and an amplifier circuit for amplifying a sawtooth wave voltage from the sawtooth wave generator circuit to supply a sawtooth wave current to the deflection circuit, wherein in order to prevent an image from being swung by the change of a D.C. component in the sawtooth wave current flowing in the deflection coil, which change is caused by the change of a power supply voltage to the sawtooth wave generator circuit, the change of the power supply voltage is detected to produce a voltage which is opposite in phase to the change of the D.C. component of the sawtooth wave voltage and the opposite phase voltage is combined with the sawtooth wave voltage to cancel the change of the D.C. component due to the change of the power supply voltage.

In the sawtooth wave generator circuit shown in the above reference, a maximum (or minimum) value of the sawtooth wave voltage developed across the capacitor is fixed to a predetermined voltage while a minimum (or maximum) value depends on a period during which the constant current is supplied to the capacitor from the current source, that is, a deflection frequency. Accordingly, the D.C. component of the sawtooth wave voltage changes not only with the change of the power supply voltage but also with the change of the deflection frequency.

The deflection frequency is determined by an oscillation frequency of the deflection circuit and it changes depending on whether the sawtooth wave generator circuit is synchronized with a synchronizing signal to oscillate at the frequency of the synchronizing signal, or the synchronizing signal is absent and the sawtooth wave generator circuit oscillates at a free-running frequency. Accordingly, when the circuit goes through an absence-of-synchronizing signal period such as channel switching period, the oscillation frequency of the sawtooth wave generator circuit and hence the deflection frequency changes from the synchronizing signal frequency to the free-running frequency and back to the synchronizing signal frequency as a result, the D.C. component of the sawtooth wave voltage changes.

It is apparent that the change of the D.C. component leads to the change of the deflection current where the sawtooth wave generator circuit is D.C.-coupled to the deflection circuit, and even when the sawtooth wave generator circuit is A.C.-coupled to the deflection coil, a transitional change in the deflection current occurrs, which leads to the swing of the image.

In many cases, the vertical deflection circuit vertically oscillates at a frequency of 0.5-3 Hz. This frequency is determined by a charge/discharge time constant of a capacitor used in an amplifier circuit which couples the sawtooth wave generator circuit and the deflection circuit and a D.C. blocking capacitor connected between the amplifier circuit and the deflection coil. Since this time constant is larger than the vertical period, the change of the oscillation frequency of the sawtooth wave generator circuit is delayed in time and appears as the change of the D.C. component of the vertical deflection current. When the period of free-running oscillation lasts for more than 20-120 vertical periods, the change on the image is sufficiently large. In addition, the oscillation at the frequency of 0.5-3 Hz (which corresponds to 120-20 vertical periods) is easily visible and obstructive to a viewer.

SUMMARY OF THE INVENTION

It is an object of the present invention to provide a deflection circuit which prevents the change of a D.C. component of a deflection current irrespective of the change of a deflection frequency.

In order to achieve the above object, according to the present invention, there are provided detection means for detecting the change of a D.C. component of a sawtooth wave voltage generated by a sawtooth wave generator circuit to produce a detection signal representative of the change of the D.C. component, and shift means, in transmitting means for converting the sawtooth wave voltage to a deflection current of a predetermined waveform to supply it to a deflection coil, for shifting a D.C. level of a transmitted signal while controlling the amount of shift of the D.C. level of the transmitted signal so that the change of a D.C. component of the deflection current due to the change of the D.C. component of the sawtooth wave voltage is cancelled out. The transmitted signal whose D.C. level is shifted in accordance with the detection signal may be a signal directly applied to the transmitting means or a signal to be directly applied to the deflection coil.

BRIEF DESCRIPTION OF THE DRAWINGS

FIG. 2 shows voltage waveforms at various points in the circuit of FIG. 1.

DESCRIPTION OF THE PREFERRED EMBODIMENT

Figure 1:
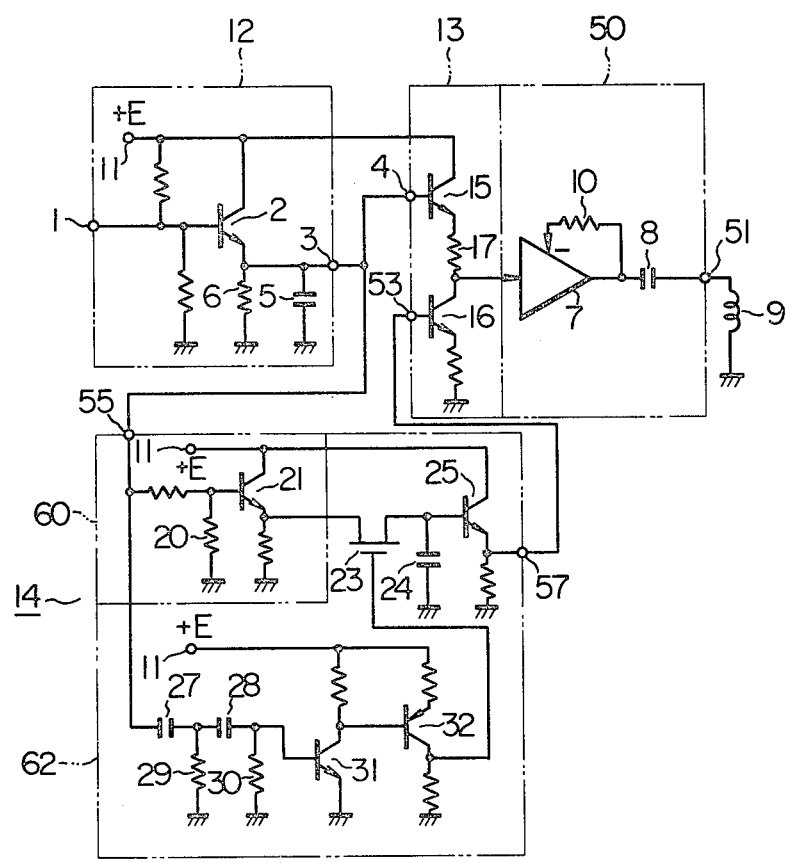
FIG. 1 is a circuit diagram illustrating one embodiment of the present invention.

FIG. 1 shows a circuit diagram of one embodiment of a vertical deflection circuit in accordance with the present invention. Applied to an input terminal 1 of a sawtooth wave generator circuit 12 is a positive polarity vertical retrace pulse of a vertical synchronizing signal period when it is in vertical synchronization, and a vertical retrace pulse of a slightly longer period than the vertical period when it is out of vertical synchronization. A transistor 2 is turned on during a pulse period or the vertical retrace period and turned off during the remaining period or the vertical scan period so that a capacitor 5 is charged to a power supply voltage, +E volts, to which a terminal 11 is connected, during the vertical retrace period, and the charge of the capacitor 5 is discharged through a resistor 6 during the vertical scan period. Accordingly, a sawtooth wave voltage as shown in FIG. 2(a) is produced at an output terminal 3 of the sawtooth wave generator circuit 12. In FIG. 2, $t_1$ represents a start time of channel switching and $t_2$ represent an end time of channel switching. Since there exists a vertical sync. signal before the time $t_1$ and after the time $t_2$, the sawtooth wave voltage of the vertical period is produced and the voltage at the output terminal 3 falls to Ea. Between the times $t_1$ and $t_2$, since the vertical sync. signal is absent, the sawtooth wave voltage of a free-running oscillation period which is slightly longer than the vertical period is produced and the voltage at the output terminal 3 falls to Eb which is lower than Ea. Accordingly, a D.C. component $E_1$ of the sawtooth wave voltage before the time $t_1$ and after the time $t_2$ is larger than a D.C. component $E_2$ of the sawtooth wave voltage between the times $t_1$ and $t_2$. This sawtooth wave voltage is applied to an input terminal 4 of a level shift circuit 13 to level shift it such that a constant D.C. component is obtained. The sawtooth wave voltage having the constant D.C. component is then amplified by an amplifier circuit 50 and the amplified voltage is supplied from an output terminal 51 to a vertical deflection coil 9 as a sawtooth wave current. The level shift circuit 13 comprises an emitter follower transistor 15, a transistor 16 which operates as a current source for generating a current in accordance with a D.C. voltage supplied to a control terminal 53 and a resistor 17 connected between an emitter of the transistor 15 and a collector of the transistor 16. If an impedance of the transistor 16 looked at the collector thereof and an input impedance of the amplifier circuit 50 are sufficiently higher than a resistance of the resistor 17, an amplitude of a sawtooth wave voltage at the collector of the transistor 16 is approximately equal to an amplitude of a sawtooth wave voltage at the emitter of the transistor 2. On the other hand, a D.C. component of the sawtooth wave voltage at the collector of the transistor 16 is lower than a D.C. component of the sawtooth wave voltage at the emitter of the transistor 2 by a sum of a forward voltage between base and emitter of the transistor 15 and a voltage drop across the resistor 17, that is, roughly the voltage drop across the resistor 17 so that the sawtooth wave voltage is shifted to a lower level by the amount of the voltage drop. Since this voltage drop is determined by the resistance of the resistor 17 and a collector current of the transistor 16, the amount of level shift of the sawtooth wave voltage can be controlled by the D.C. voltage applied to the control terminal 53.

The amplifier circuit 50 which comprises an amplifier 7, a D.C. blocking capacitor 7 and a negative feedback resistor 10 is a conventional amplifier for the vertical deflection circuit.

A detection circuit 14 comprises a sawtooth wave sampling circuit 60 and a control circuit 62, and it responds to the sawtooth wave voltage supplied to an input terminal 55 (FIG. 2(a)) to produce at an output terminal 57 a D.C. voltage (FIG. 2(d)) which changes in accordance with the change of a D.C. component in the sawtooth wave voltage. Developed at an emitter of a transistor 21 is a voltage having modified D.C. level and A.C. level from those of the voltage shown in FIG. 2(a), that is, a voltage which is constant during the vertical retrace period and having a waveform which is analogous to the waveform shown in FIG. 2(a). This voltage is supplied to a drain of a MOS FET 23.

On the other hand, the sawtooth wave voltage supplied to the input terminal 55 is differentiated twice by capacitors 27 and 28 and resistors 29 and 30 so that positive and negative pulse voltage as shown in FIG. 2(b) is generated at a base of a transistor 31. The positive pulse voltage is developed at a time of very rapid rise of the vertical retrace period and the transistor 31 is turned on by the positive pulse voltage and hence a transistor 32 is also turned on. Accordingly, a pulse voltage as shown in FIG. 2(c) is developed at a collector of the transistor 32 and this pulse voltage is applied to a gate of the MOS FET 23, which in turn conducts during the pulse period so that the capacitor 24 is charged to an emitter voltage of the transistor 21 at the end of the pulse. During a period in which the pulse voltage of FIG. 2(c) is not supplied to the gate of the MOS FET 23, the MOS FET 23 is nonconductive. If a base current of a transistor 25 so sufficiently small that it can be neglected, the charge voltage of the capacitor 24 is held until a next pulse is supplied to the gate of the MOS FET 23, and each time the pulse is applied, the charge voltage of the capacitor 24 is restored to a voltage which is equal to the emitter voltage of the transmitter 21 at the end of the pulse voltage. Since the pulse voltage of FIG. 2(c) is developed at the rise of the vertical retrace period, the change of the charge voltage of the capacitor 24 shown in FIG. 2(d) corresponds to the change of the minimum value (Ea or Eb) of the sawtooth wave voltage shown in FIG. 2(a) and hence to the change of the D.C. component of the sawtooth wave voltage.

When the rise of the sawtooth wave voltage shown in FIG. 2(a) is slow, it is true that the voltage stored in the capacitor 24 actually corresponds to the emitter voltage of the transistor 2 at the end of the vertical scan period, but when the sawtooth wave voltage shown in FIG. 2(a) rises ideally rapidly, the termination time of the gate pulse shown in FIG. 2(c) lies within the vertical retrace period. In this case, an appropriate capacitor may be connected in parallel with a resistor 20 connected between the base of the transistor 21 and ground to delay the rise of the sawtooth wave voltage developed at the emitter of the transistor 21 so that a voltage corresponding to the emitter voltage of the transistor 2 at the end of the vertical scan period can be stored in the capacitor 24.

The charge voltage of the capacitor 24 shown in FIG. 2(d) is supplied to an output terminal 57 through a transistor 25 which operates as an emitter follower so that a voltage at the output terminal 57 also substantially corresponds to the waveform shown in FIG. 2(d). As a result, a D.C. voltage developed at the output terminal 57 changes with the change of the oscillation frequency, that is, the change of the D.C. component of the sawtooth wave voltage. Since the magnitude of the collector current of the transistor 16 changes depending on the magnitude of the D.C. voltage at the output terminal 57, the voltage drop across the resistor 17 and hence the amount t of level shift of the sawtooth wave voltage changes with the change of the D.C. voltage at the output terminal 57. As a result, a sawtooth wave of a constant D.C. component is produced at the collector of the transistor 16.

While the sawtooth wave voltage derived at the emitter of the transistor 2 is used as the input signal to the control circuit 14 in the illustrated embodiment, the sawtooth wave voltage derived at the collector of the transistor 16 may be used.

Furthermore, since the change of the D.C. component of the sawtooth wave voltage is due to the change of the oscillation frequency, the change of the oscillation frequency (e.g. the change of period of the vertical retrace pulse) may be detected to derive the D.C. voltage as shown in FIG. 2(d).

What is claimed is:

1. In a deflection circuit comprising a deflection coil, a sawtooth wave voltage source for generating a sawtooth wave voltage a D.C. level of which varies in accordance with a deflection frequency thereof, and transmitting means for transmitting said sawtooth wave voltage therethrough and outputting a sawtooth wave current representative of the thus transmitted sawtooth wave voltage, which sawtooth wave current is to be supplied to said deflection coil, the improvement which comprises:

shift means provided in said transmitting means for shifting the D.C. level of the sawtooth wave voltage transmitted through said transmitting means in accordance with a control signal applied to said shift means, sampling means for extracting from said deflection circuit a sampled signal having a varying component which varies in accordance with the change of the D.C. level of said sawtooth wave voltage, and control means connected between said sampling means and said shift means for detecting the varying component of said sampled signal to produce the control signal representative of the detected varying component, said control signal being of a sufficient magnitude to cause the shift of the D.C. level of said transmitted sawtooth wave voltage due to said control signal to cancel the change of a D.C. level of said sawtooth wave current due to the change of the D.C. level of said sawtooth wave voltage.

2. A deflection circuit according to claim 1 wherein said sampling means extracts the sampled signal from the sawtooth wave voltage wherein a voltage level of said sawtooth voltage at the end of each of a plurality of scans changes in accordance with changes in the deflection frequency, and said control means includes extracting means for extracting the voltage at the end of each scan from said sawtooth wave voltage and holding means for holding the extracted voltage at the end of the scan until the next extraction.

3. A deflection circuit according to claim 2 wherein said extracting means includes a pulse generator for generating a pulse at the end of each scan and a switch connected between said sampling means and said holding means and adopted to be turned on when the pulse from said pulse generator is applied thereto and turned off when it is not applied.

4. A deflection circuit according to claim 3 wherein said holding circuit comprises a capacitor.

5. A deflection circuit according to claims 1, 2, 3 or 4 wherein said shifting means is inserted immediately following to said sawtooth wave voltage source.

6. A deflection circuit according to claim 2, wherein the scans are vertical scans and further wherein the presence or absence of a vertical sync signal causes changes in the deflection frequency which changes the level of the sawtooth voltage at the end of the scans.

7. A deflection circuit comprising:

a vertical deflection coil;

a sawtooth wave voltage generator for generating a sawtooth wave voltage whose frequency is equal to a vertical frequency when a vertical synchronizing signal is supplied thereto but unequal to said vertical frequency when said vertical synchronizing signal is not supplied thereto, a D.C. component of said sawtooth wave voltage varying in accordance with a frequency of said sawtooth wave voltage;

shift means having a control terminal for shifting a D.C. level of said sawtooth wave voltage transmitted therethrough, the shift amount varying in accordance with a control signal supplied to said control terminal;

a current generator supplied with an output signal of said shift means for flowing through said vertical deflection coil a sawtooth wave current representative of said output signal; and control means connected to said sawtooth wave voltage generator and said control terminal of said shift means for producing said control signal for shifting said D.C. level of the sawtooth wave voltage to cancel a change of said D.C. component caused by a change of said frequency of said wave voltage to thereby prevent changes in a D.C. level of said output signal.

8. In a deflection circuit comprising:

a vertical deflection coil, a sawtooth wave voltage generator for generating a vertical scanning sawtooth wave voltage whose frequency is normally synchronous with a vertical scanning frequency when a vertical synchronizing signal is supplied to said generator but may be asynchronous with the vertical scanning frequency when the vertical synchronizing signal is not supplied, so that a D.C. level of said vertical scanning sawtooth wave voltage varies in accordance with the variation in the frequency thereof, and transmitting means for converting said sawtooth wave voltage to a vertical scanning sawtooth wave current which is to be supplied to said deflection coil, the improvement which comprises:

sampling means for detecting the change in the frequency of said vertical scanning sawtooth wave voltage so as to produce a control signal representative of the D.C. level of said vertical scanning sawtooth wave voltage, and shift means provided in said transmitting means for operatingly shifting the D.C. level of the vertical scanning sawtooth wave voltage in such a direction that the variation of the D.C. level of said vertical scanning sawtooth wave voltage is suppressed, in accordance with the control signal supplied thereto from said sampling means.

* * * * *